Jan. 21, 1958 S. SHERR 2,820,855
HIGH IMPEDANCE TRANSISTOR AMPLIFIER
Filed July 7, 1955
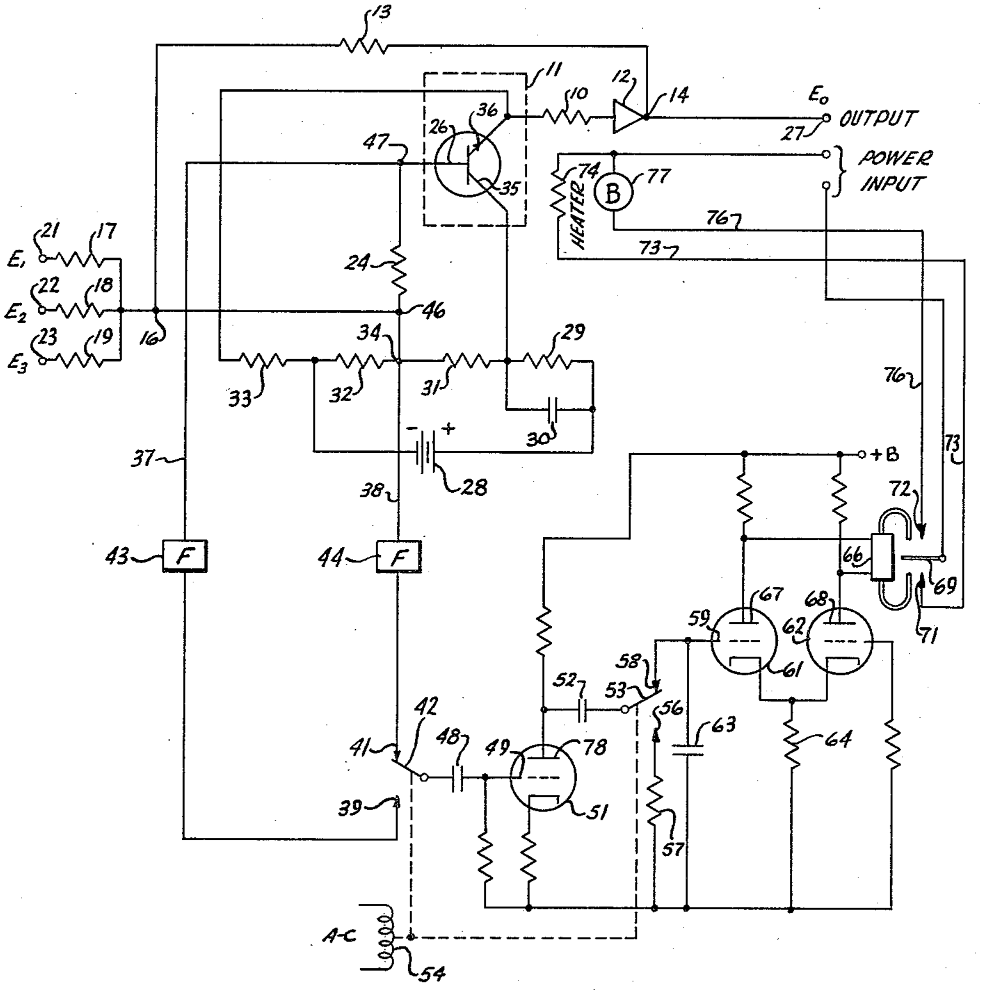
INVENTOR.
SOLOMON SHERR
BY H. L. Mackey
ATTORNEY United States Patent Office 2,820,855

Patented Jan. 21, 1958

2,820,855

HIGH IMPEDANCE TRANSISTOR AMPLIFIER

Solomon Sherr, Yonkers, N. Y., assignor to General Precision Laboratory Incorporated, a corporation of New York Application July 7, 1955, Serial No. 520,533

7 Claims. (Cl. 179—171)

This invention relates to transistors and more specifically to transistor amplifier circuits having high input resistance and low input current.

Transistors are comparatively low-impedance devices, and in particular their input resistances cannot ordinarily be made to approach infinity as can an electronic tube input grid circuit. Transistors have not therefore in the past been considered useful in circuits requiring very high input resistance such as, for example, adding, integrating and differentiating circuits depending upon resistance-inductance-capacitance networks in combination with a high gain amplifier. For example, transistor amplifier stages with grounded collector, grounded emitter or grounded base have input resistances of the order of 200,000, 850 and 70 ohms respectively.

In any conventional transistor amplifier circuit both input and output bias currents must flow in order that there shall be amplification of the input signal. If the bias currents be adjusted to bring the base electrode bias current to zero, amplification is prevented. If an external voltage be applied so that the base current is reduced to zero, amplification may be secured and if the base electrode be made to constitute the input, zero input current is attained in the steady-state condition. However, the input impedance for alternating signals is not increased.

It has been discovered, however, that the transistor base current is highly sensitive to transistor temperature, and that if temperature be increased to the point where the base bias current is nearly or quite zero, the amplifying property of the transistor is preserved and in addition the steady-state input signal current is reduced to substantially zero. Furthermore, and most important, the input impedance presented to alternating current input signals is increased. These statements are true, however, only in a compensating or stabilizing circuit, that is, a circuit which prevents emitter and collector currents from varying substantially when the base current is changed as the result of temperature change.

The discovery is primarily applicable to three amplifier circuit arrangements: grounded collector with the input applied to the base, grounded emitter with the input applied to the base; and grounded base with the input applied to the emitter.

The classical current relations in a grounded emitter transistor amplifier stage with single battery supply are represented by $$I_e=\frac{I_c-I_{co}}{\alpha} \qquad (1)$$

and $$I_b=I_e(1-\alpha)-I_{co} \qquad (2)$$

in which:

$I_c$ is collector current,
$I_{co}$ is collector current for zero emitter current.
$I_e$ is emitter current,
$I_b$ is base current, and
$\alpha$ is current gain.

Equation 2 states that at some value of $I_{co}$, $I_b$ is zero, and that, at a lower value of $I_{co}$, $I_b$ is positive, while at a higher value $I_b$ is negative. It is well known that $I_{co}$ varies widely with temperature, and that an increasing temperature rapidly increases $I_{co}$. It has been found that the junction transistor base bias current usually becomes zero when the transistor is brought to a temperature in the vicinity of +65° C. Above this temperature the base bias current increases in the reverse direction.

The present invention provides instrumentation to maintain a stabilized transistor at such temperature so as to have zero base bias current. An input bias current detector is provided together with a control circuit actuated thereby. The control circuit controls the ambient transistor temperature, this control automatically keeping the transistor at optimum temperature corresponding to zero base bias current.

The employment of the circuit of the invention reduces transistor base input current to not over a few microamperes and increases the input signal impedance, this increase in the case of the grounded collector circuit being measured in megohms. The amplification is, moreover substantially as high as the amplification in a conventional circuit. The transistor amplifier is thereby made suitable for use in adding, integrating and differentiating circuits, all of which require for high accuracy a high-gain amplifier having high impedance input and negligible input current.

The purpose of this invention is to provide a transistor amplifier circuit having zero or nearly zero input bias current and having high input signal impedance.

A further understanding of this invention may be secured from the detailed description and drawing, in which the single figure of the drawing is a schematic diagram of an embodiment of the invention.

As an example of one use of the invention, a summing circuit combined with a high gain amplifier is depicted in the drawing. The amplifier comprises a transistor stage 11 employing an n-p-n junction transistor. The circuit is of the grounded collector type with base input and emitter output, which has higher input impedance than either the grounded emitter or grounded base type. The transistor amplifying stage output is coupled through a resistor 10, having such resistance as to enhance the input impedances, to one or more other amplification stages 12. Voltage negative feedback is indicated by a resistor 13 joining the amplifier output terminal 14 to the input terminal 16. The summing circuit includes three input resistors 17, 18 and 19 to which are applied three voltages $E_1$, $E_2$ and $E_3$ at their input terminals 21, 22 and 23. If it be assumed that the input bias current through the external resistor 24 to the input base electrode 26 of transistor 11 be zero, and that the input impedance at signal frequency be infinity, then the sum of the currents in resistors 17, 18 and 19 equals the current in resistor 13, and the voltage drop in resistor 13 is a function of the sum of input voltages $E_1$, $E_2$ and $E_3$. If the circuit be adjusted so that the potential of junction 16 is at ground potential, then the potential $E_0$ of the output terminal 27 relative to ground is the sum of the potentials $E_1$, $E_2$ and $E_3$ relative to ground.

Transistor 11 is energized from a single battery 28 through a resistance network consisting of resistors 29, 31, 32 and 33 comprising a stabilizing circuit. Resistor 29 is shunted by a capacitor 30 to place the collector at ground potential for alternating current signals. This stabilizing circuit is described in the patent application entitled Stabilized Transistor Circuit, Serial No. 425,872, by Solomon Sherr, filed April 27, 1954. In the operation of this circuit when the current of collector 35 changes because of temperature change or because of replacement of the transistor by one of different characteristics, the voltage drop in resistor 29 is affected, changing the potential of intermediate terminal 34 and of the base electrode 26 connected thereto relative to the emitter electrode 36. This base-emitter bias potential change is in such direction as to tend to overcome the collector current change.

The existence of base current and also its direction of flow are sensed by the small series base resistor 24 associated with a chopper and rectifier circuit. This circuit includes conductors 37 and 38 interconnecting the two ends of resistor 24 to two fixed contacts 39 and 41 of a chopper armature 42. Filter circuits 43 and 44 are inserted in conductors 37 and 38 and have such characteristics as to filter signal current from the vibrator contacts 39 and 41 while presenting high impedance to the input signal. Additionally these filters permit the slow voltage changes of the terminals 46 and 47 of resistor 24 to be impressed on contacts 39 and 41, these changes being of the order of the chopper frequency. The chopper frequency is not at all critical, and may be in the range from one to one hundred cycles per second.

The chopper armature 42 is coupled by capacitor 48 to the control grid 49 of an electronic tube 51. Any difference in potential of the contacts 39 and 41 is therefore impressed as a square wave alternating potential on grid 49. This potential is amplified by tube 51 and coupled by capacitor 52 to a rectifying contact armature 53. Armatures 42 and 53 are vibrated in synchronism and phase by a common solenoid 54 which is operated by an alternating current of any desired frequency. Associated with armature 53 is contact 56 grounded through resistor 57 to normalize the charge of capacitor 52 during one-half of each vibrating cycle. The other contact 58 is connected to control grid 59 of a tube 61 which together with tube 62 constitutes a differential amplifier. Grid 59 is grounded through a capacitor 63. The amplifier has a common cathode resistor 64. A polarized relay 66 is connected between anodes 67 and 68. The polarized relay armature 69 has three positions: a middle position when deenergized, a second position making contact with fixed contact 71, in which case anode 67 is more positive than anode 68, and a third position engaging contact 72 in which case anode 68 is more positive than anode 67. Contact 71 is connected through conductor 73 to a heater resistor 74 and contact 72 is connected through conductor 76 to a blower motor 77. Heater 74 and blower 77 are each positioned to heat and cool the transistor 11.

In the operation of this circuit, assuming an initial temperature of +25° of the n-p-n transistor 11, a base bias current of several microamperes will normally flow toward the transistor junction in its base electrode 26. This current flowing in the detector resistor 24 makes terminal 46 positive relative to terminal 47 and accordingly chopper contact 41 is positive relative to contact 29. Since armature 53 vibrates in synchronism with armature 42 and engages grounded contact 56 when armature 42 engages contact 39, the positive half cycle of the amplified and therefore inverted rectangular alternating voltage wave is the base reference applied to armature 53, and the negative half cycles impress a potential which is negative relative ground on contact 58. The amplitude is a function of the voltage divider constituted by capacitors 52 and 63 connected in series between anode 78 and ground. Capacitor 63 maintains the potential of grid 59 constant between charges. Since grid 59 is more negative than ground, the potential of anode 67 is increased while that of anode 68 is differentially decreased. Current therefore flows through the polarized relay 66 from anode 67 to anode 68, which is in such direction as to cause contact 71 to close. This energizes heater 74, heating the transistor 11. This as before stated causes the base bias current to become less, reaching zero at a temperature of, for example, +65° C. This reduces the alternating current signal applied to triode 51 to zero, so that grid 59 attains ground potential and anodes 67 and 68 are at the same potential. The polarized relay 66 then becomes deenergized and opens the circuit of heater 74.

If the transistor should become hotter than its zero base current temperature of 65° the alternating signal to triode 51 is reversed in phase and the signal applied to grid 59 of triode 61 is more positive than ground potential. The polarized relay then makes contact with its contact 72, turning on the blower motor 77 and cooling the transistor by a blast of cool air.

Numerous variations of the circuit can be made without departing from the spirit of the invention. For example, the servo loop closed by the electronic tubes 51, 61 and 62 and relay 66 may take numerous other forms. Transistors may be substituted for some or all of the electronic tubes and the amplifying stages may be either more or fewer than described. The transistor 11 may be either n-p-n or p-n-p with appropriate battery polarity. The non-polar relays may be substituted for the described polar relay or a magnetic amplifier or other transducer may be substituted for the relays. Instead of the bias network arrangement including resistors 29, 31, 32 and 33 for making collector and emitter currents relatively independent of temperature, there may be employed any one of several other different network arrangements for accomplishing the same purpose in varying degree. The means for controlling transistor temperature need not be a heater-blower combination for alternatively heating or cooling the transistor, but may be any device for bringing its temperature to the required value at which the base bias current is zero. For example, the cooling may be by unaided heat radiation.

What is claimed is:

1. A high impedance transistor amplifier comprising, detecting means sensitive to sense of electrical current flow in the base electrode of said transistor, control means controlled by said detecting means, and temperature-controlling means associated with said transistor controlling the temperature thereof, said temperature-controlling means being controlled by said control means; said transistor, detecting means, control means, and temperature-controlling means constituting a closed loop servo maintaining said base current substantially at zero magnitude.

2. A high impedance transistor amplifier comprising, detecting means sensitive to sense of direct bias current flow in the base electrode of said transistor, control means controlled by the output of said detecting means, and temperature-controlling means controlling the temperature of said transistor and controlled by said control means; said transistor, detecting means, control means, and temperature-controlling means constituting a closed loop servo in which effect of temperature on the base direct bias current is in the degenerative and negative feedback sense tending to reduce said current to zero and thereby increasing both the virtual base direct-current resistance and the actual base impedance offered to signal potentials.

3. A high impedance transistor amplifier having a base input electrode comprising, direct-current detecting means for detecting the sense of bias current flow in said base electrode and having an electrical output, control means controlled by said electrical output, and temperature-controlling means for bringing the temperature of said transistor to a required value, said temperature-controlling means being controlled by said control means, said required value of temperature being that at which said base direct-current bias current becomes zero.

4. A high impedance transistor amplifier having a base input electrode comprising, a direct-current detector including a resistor in series with said base input electrode carrying all of the bias current thereof and a chopper vibrator having at least one contact connected to said resistor whereby the vibrating armature thereof is impressed with alternating potential representative of the magnitude of the direct current flowing through said resistor, a capacitor connected to said vibrating armature and charged and discharged thereby in accordance with said alternating potential, means synchronously rectifying said capacitor potential and having an output representative of both sense and amplitude of said bias current, means amplifying said synchronous rectifier potential and having a power output, and temperature-controlling means controlled by said power output and controlling the temperature of said transistor to a selected value, said selected value being maintained by servo action at that magnitude which maintains said base bias current at zero magnitude.

5. A high impedance transistor amplifier in accordance with claim 4 in which the amplified output is derived from the emitter electrode of the transistor.

6. A high impedance transistor amplifier having a base input electrode comprising, a direct-current detector including a resistor in series with said base input electrode, said resistor carrying all of the base bias direct current, and a chopper vibrator having at least one terminal connected to said resistor, a capacitor connected to said chopper vibrator, an amplifier amplifying the potentials of said capacitor, a vibrating rectifier rectifying said amplifier output, means vibrating said chopper vibrator and said vibrating rectifier in synchronism and phase to produce at the output thereof direct current representative of the amplitude and sense of said base bias direct current, heat exchanging means for maintaining the temperature of said transistor at a selected value, and means for controlling said heat exchanging means by the output of said vibrating rectifier, said selected value being that temperature at which said base bias direct current is zero.

7. A high impedance transistor amplifier in accordance with claim 6 in which said heat exchanging means includes means for heating and cooling said transistor depending on the temperature level thereof at any selected interval of time.

References Cited in the file of this patent

UNITED STATES PATENTS

| | | |
|---|---|---|
| 2,469,569 | Ohl | May 10, 1949 |
| 2,568,435 | Downey | Sept. 18, 1951 |
| 2,579,336 | Rack | Dec. 18, 1951 |
| 2,622,211 | Trent | Dec. 16, 1952 |
| 2,714,136 | Greenwood | July 26, 1955 |

OTHER REFERENCES

Shea: "Transistor Circuits," John Wiley & Sons, Inc. (Copyright Sept. 15, 1953), particularly pages 169–181.